United States Patent [19]

Iwamatsu

[11] 4,302,727
[45] Nov. 24, 1981

[54] POWER AMPLIFIER HAVING BIAS CIRCUIT WITH TEMPERATURE COMPENSATION

[75] Inventor: Masayuki Iwamatsu, Shizuoka, Japan

[73] Assignee: Nippon Gakki Seizo Kabushiki Kaisha, Hamamatsu, Japan

[21] Appl. No.: 91,485

[22] Filed: Nov. 5, 1979

[30] Foreign Application Priority Data

Nov. 16, 1978 [JP] Japan .................. 53-141487

[51] Int. Cl.³ .............................................. H03F 3/26
[52] U.S. Cl. .................................... 330/266; 330/272; 330/289
[58] Field of Search ................ 333/266, 272, 289, 307

[56] References Cited
PUBLICATIONS

Kalanit Low Voltage Audio Amplifier Wireless World, vol. 82, No. 1490, p. 74, Oct. 1976.

Primary Examiner—James B. Mullins
Assistant Examiner—Gene Wan
Attorney, Agent, or Firm—Frishauf, Holtz, Goodman & Woodward

[57] ABSTRACT

In a single-ended push-pull power amplifier, a transistor is provided which detects the collector power dissipation of one of complementary power transistors. The power dissipation detecting transistor is thermally coupled with a temperature compensation transistor in a bias circuit coupled to the complementary transistors for flowing a substantially constant idle or bias current through the complementary power transistors.

10 Claims, 2 Drawing Figures

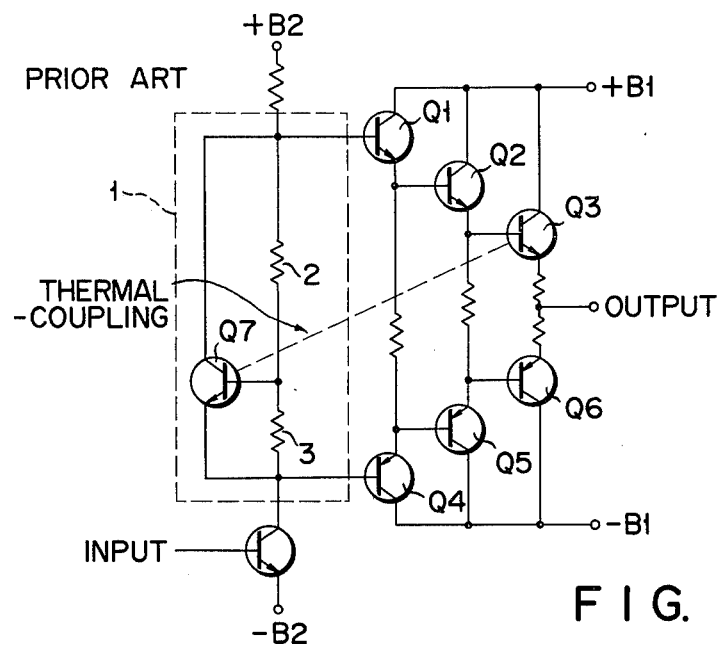
F I G. 1
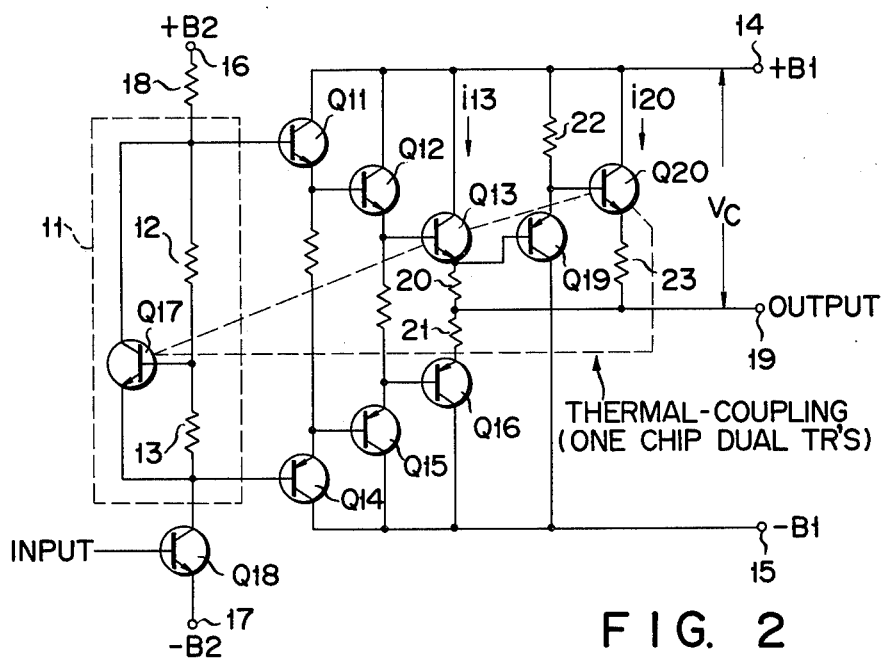
F I G. 2

POWER AMPLIFIER HAVING BIAS CIRCUIT WITH TEMPERATURE COMPENSATION

BACKGROUND OF THE INVENTION

This invention relates to a transistor power amplifier having a bias circuit with temperature compensation.

A transistor power amplifier is normally provided with a bias circuit having temperature compensation capability in order to prevent shifting of the operating point of power transistors resulting from changes in ambient temperature and self-heating of the power transistors. For example, as shown in FIG. 1, a class B power amplifier having NPN transistors Q1, Q2, Q3 and PNP transistors Q4, Q5, Q6 connected in a complementary SEPP (single-ended push-pull) configuration is provided with a bias circuit 1 with temperature compensation connected between the bases of the transistors Q1 and Q4 so as to flow a substantially constant idle current through each of transistors Q1 through Q6. Among the transistors Q1 through Q6, the transistors Q3 and Q6 are power transistors which handle a fairly large power. The bias circuit 1 is comprised of resistors 2 and 3 connected in series between the bases of transistors Q1 and Q4 and an NPN transistor Q7 having its base connected to the connection point between the resistors 2 and 3 and its collector-to-emitter path connected between the bases of transistors Q1 and Q4. The transistor Q7 is thermally coupled with one of the power transistors Q3 and Q6 (the transistor Q3 in this example). The thermal-coupling between the transistors Q3 and Q7 is usually achieved by mounting the case of transistor Q7 on the case of transistor Q3.

Being responsive to a change in the base-to-emitter voltage $V_{BE}$ of transistor Q7 with temperature, the bias circuit 1 varies the base-to-base voltage of transistors Q1 and Q4 such that a change in the base-to-emitter voltage $V_{BE}$ of each of transistors Q1 to Q6 resulting from a change in temperature is offset to flow a constant idle current through each of transistors Q1 to Q6.

This temperature compensation prevents the destruction of transistors resulting from thermal runaway thereof and the occurrence of crossover distortion resulting from the shortage of idle current.

A change in the junction temperature of a transistor arises mainly from three factors: (1) a change in ambient temperature; (2) self-heating of the transistor at zero signal condition due to the collector power dissipation resulting from the idle current; and (3) self-heating of the transistor due to the collector power dissipation when an AC power output is delivered to a load. The circuit of FIG. 1 can effectively achieve the temperature compensation for the above-mentioned factors (1) and (2). However, the temperature compensation for the factor (3) cannot be effectively achieved because the circuit of FIG. 1 is arranged to detect only the case temperature of the power transistor Q3.

Namely, the collector power dissipation, in other words, the junction temperature $T_j$ of the power transistor increases much more at signal input conditions than at zero signal condition. As a result, the junction temperature $T_j$ becomes much higher than the case temperature $T_c$. Difference between $T_j$ and $T_c$ approximately equals the product of the collector power dissipation P of power transistor and the thermal resistance $\theta_{jc}$ between the transistor junction and the transistor case. Since the thermal resistance $\theta_{jc}$ is constant, $T_j - T_C$ is proportional to the collector power dissipation of the power transistor. This means that the junction temperature of the power transistor greatly varies with collector power dissipation as compared with the case temperature of the power transistor. In other words, a change in $V_{BE}$ of the power transistor Q3 is much greater than a change in $V_{BE}$ of the temperature compensating transistor Q7. With the circuit of FIG. 1 which detects only the case temperature of the power transistor Q3, therefore, it is substantially impossible to effectively achieve the temperature compensation for changes in junction temperature of the power transistor with collector power dissipation. As a result, crossover distortion will occur due to the shifting of the operating point of power transistor.

SUMMARY OF THE INVENTION

It is an object of this invention to provide an improved transistor power amplifier which effectively achieves temperature compensation for changes in junction temperature of power transistors with their collector power dissipations.

In accordance with this invention, a transistor power amplifier is provided with an element which detects the collector power dissipation of a power transistor and is thermally coupled with a temperature compensating transistor in a bias circuit coupled to complementary power transistors for flowing a constant idle current through the power transistors.

The temperature compensating transistor is thermally coupled with one of the power transistors to detect the case temperature of the power transistor as in a conventional power amplifier. A thermal feedback amount to the temperature compensating transistor is much increased so that temperature compensation for changes in junction temperature of the power transistors with their collector power dissipations may be effectively achieved.

In a preferred embodiment of this invention, a transistor is used to detect the collector power dissipation of the power transistor. The transistor is so arranged as to be self-heated by its collector power dissipation proportional to the collector power dissipation of the power transistor.

BRIEF DESCRIPTION OF THE DRAWINGS

FIG. 1 is a shematic circuit diagram of a prior art power amplifier with a temperature compensation bias circuit; and FIG. 2 is a schematic circuit diagram of a power amplifier embodying this invention.

DESCRIPTION OF THE PREFERRED EMBODIMENT

In a power amplifier of FIG. 2, like the power amplifier of FIG. 1, transistors Q11 to Q16 are connected in a single-ended push-pull configuration between power supply terminals 14 (+B1) and 15 (−B1), and a bias circuit 11 comprised of resistors 12 and 13 and a temperature compensation transistor Q17 is connected between the bases of transistors Q11 and Q14. The bias circuit 11 has both ends connected, as shown, to power supply terminals 16 (+B2) and 17 (−B2) through a load resistor 18 and a driver transistor Q18, respectively. An emitter resistor 20 is connected between the emitter of power transistor Q13 and an output terminal 19 of the power amplifier, and an emitter resistor 21 is connected between the emiter of power transistor Q16 and the output terminal 19.

In this embodiment, a PNP transistor Q19 and an NPN transistor Q20 are provided. The transistor Q19 has its emitter connected to the power supply terminal 14 through a resistor 22, its collector connected to the power supply terminal 15, and its base connected to the connection point between the emitter of power transistor Q13 and the resistor 20. The transistor Q20 has its collector connected to the power supply terminal 14, its emitter connected to the output terminal 19 through a resistor 23, and its base connected to the connection point between the emitter of transistor Q19 and the resistor 22.

The circuit including the transistors Q19 and Q20 is provided for detecting the collector power dissipation of power transistor Q13. The transistor Q20 is thermally coupled with the transistor Q17 as shown by a dashed line. For this thermal-coupling, it is particularly desired that the transistors Q17 and Q20 be one chip dual transistors. Alternatively, the transistors Q17 and Q20 may be housed in a common package or the case of transistor Q20 may be soldered to the case of transistor Q17. Further, the thermal-coupled transistors Q17 and Q20 are thermally coupled with the power transistor Q13 as shown by dashed lines in the same manner as between the transistors Q3 and Q7 in FIG. 1.

In the circuit of FIG. 2, the transistor Q19 and the resistor 22 are provided in order that a voltage drop across the emitter resistor 23 of transistor Q20 may be equal to that across the emitter resistor 20 of power transistor Q13. That is, if an operating point of the transistor Q19 is set by the resistor 22 such that the base-to-emitter voltage of transistor Q19 offsets the base-to-emitter voltage $V_{BE}$ of transistor Q20, then the voltage drop across the emitter resistor 23 of transistor Q20 becomes equal to the voltage drop across the emitter resistor 20 of power transistor Q13.

The collector power dissipations P13 and P20 of transistors Q13 and Q20 are represented as follows:

$$P13 = i13 \, (V_C - i13 \cdot R20) \quad (1)$$

$$P20 = i20 \, (V_C - i20 \cdot R23) \quad (2)$$

where i13 is the collector current of the transistor Q13, i20 the collector current of the transistor Q20, R20 the resistance value of the resistor 20, R23 the resistance value of the resistor 23, and $V_C$ the voltage between the power supply terminal 14 and the output terminal 19.

As described above, since the voltage drop across the resistor 20 equals the voltage drop across the resistor 23, $i20 = i13 \cdot R20/R23$. Accordingly, equation (2) can be rewritten as follows:

$$P20 = \frac{i13 \cdot R20}{R23} (V_C - i13 \cdot R20) \quad (3)$$
$$= \frac{R20}{R23} \cdot P13$$

As will be evident from equation (3) the collector power dissipation P20 of transistor Q20 is proportional to the collector power dissipation P13 of power transistor Q13. Accordingly, the transistor Q20 is self-heated by its collector power dissipation P20 which is proportional to the collector power dissipation P13 of power transistor Q13, with the result that the temperature of transistor Q20 is transmitted to the temperature compensating transistor Q17.

With the circuit of this invention as described above, the temperature compensation for a change in ambient temperature and the self-heating of power transistor at zero signal condition is effectively achieved like the prior art circuit. On the other hand, the temperature compensation for the self-heating of power transistors at signal input conditions can be achieved more effectively than in the prior art circuit since the amount of thermal feedback to the temperature compensation transistor greatly increases as compared with the prior art circuit due to the provision of a transistor which detects the collector power dissipation of the power transistor. Although the collector power dissipation or the junction temperature of a power transistor changes from instant to instant with time-varying signal level, the circuit of this invention permits a temperature compensation which well follows such changes in the junction temperature of the power transistor.

Although, in the circuit of FIG. 2, a transistor is used to detect the collector power dissipation of power transistor, other heating elements may be used instead.

What is claimed is:

1. A power amplifier comprising:
   complementary power transistors connected between power supply terminals;
   detection circuit means coupled to said complementary power transistors for detecting a collector power dissipation of one of said complementary power transistors, said detection circuit means including a transistor which is heated by detection of said collector power dissipation of said one of said power transistors; and
   bias circuit means coupled to said complementary power transistors for flowing a substantially constant bias current through said complementary power transistors, said bias circuit means including a temperature compensation transistor which is thermally coupled with said transistor of said detection circuit means.

2. The power amplifier according to claim 1 wherein said temperature compensation transistor is thermally coupled with said one of said power transistors.

3. A power amplifier comprising:
   complementary power transistors connected between power supply terminals;
   detection circuit means coupled to said power transistors for detecting a collector power dissipation of one of said power transistors, said detection circuit means including a transistor whose collector power dissipation is substantially proportional to the collector power dissipation of said one of said power transistors; and
   bias circuit means coupled to said power transistors for flowing a substantially constant bias current through said power transistors, said bias circuit means including a temperature compensation transistor which is thermally coupled with said transistor of said detection circuit means.

4. The power amplifier according to claim 3 wherein said temperature compensation transistor is thermally coupled with said one of said power transistors.

5. The power amplifier according to claim 3 wherein said transistor of said detection circuit means and said temperature compensation transistor are one chip dual transistors.

6. A power amplifier comprising:

a single-ended push-pull output circuit connected between first and second power supply terminals and including first and second complementary power transistors, said first transistor having its collector connected to said first power supply terminal and its emitter connected to an output terminal of said output circuit through a first emitter resistor and said second transistor having its collector connected to said second power supply terminal and its emitter connected to said output terminal of said output circuit through a second emitter resistor;

a third transistor of the same conductivity type as said second power transistor, said third transistor having its base connected to the connection point between the emitter of said first power transistor and said first emitter resistor, its emitter connected to said first power supply terminal through a resistor and its collector connected to said second power supply terminal;

a fourth transistor of the same conductivity type as said first power transistor, said fourth transistor having its base connected to said emitter of said third transistor, its collector connected to said first power supply terminal and its emitter connected to said output terminal through a resistor; and bias circuit means coupled to bases of said first and second power transistors for flowing a substantially constant idle current through said first and second power transistors, said bias circuit means having a temperature compensation transistor which is thermally coupled with said fourth transistor.

7. The power amplifier according to claim 6 wherein said temperature compensation transistor is thermally coupled with said first power transistor.

8. The power amplifier according to claim 6 wherein said fourth transistor and said temperature compensation transistors are one chip dual transistors.

9. A power amplifier comprising:
complementary power transistors connected between power supply terminals;
detection circuit means coupled to said complementary power transistors for detecting the collector power dissipation of one of said complementary power transistors by detecting an amount of current which is proportional to the current flowing through one of said complementary power transistors, said detection circuit means including an active element which generates heat in response to said amount of current; and
bias circuit means coupled to said complementary power transistors for flowing a substantially constant bias current through said complementary power transistors, said bias circuit means includes a temperature compensation transistor which is thermally coupled with said active element of said detection circuit means.

10. The power amplifier according to claim 9, wherein said active element of said detection circuit means is a transistor.

* * * * *